(12) United States Patent
Johnson et al.

(10) Patent No.: US 7,719,595 B1
(45) Date of Patent: May 18, 2010

(54) PREVIEW MODE LOW RESOLUTION OUTPUT SYSTEM AND METHOD

(75) Inventors: Sandra M. Johnson, Buda, TX (US); Douglas R. Holberg, Wimberley, TX (US); Nadi R. Itani, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 374 days.

(21) Appl. No.: 11/980,173

(22) Filed: Oct. 30, 2007

Related U.S. Application Data

(63) Continuation of application No. 10/742,170, filed on Dec. 19, 2003, now Pat. No. 7,304,679, which is a continuation of application No. 09/282,524, filed on Mar. 31, 1999, now Pat. No. 6,686,957.

(51) Int. Cl.
- H04N 5/222 (2006.01)
- H04N 5/228 (2006.01)
- H03M 1/12 (2006.01)
- H03M 1/38 (2006.01)

(52) U.S. Cl. ............... 348/333.01; 348/222.1; 348/572; 341/161

(58) Field of Classification Search ............ 348/333.11, 348/333.01, 333.13, 229.1, 255, 254, 572, 348/573; 341/139, 161, 162
See application file for complete search history.

(56) References Cited

U.S. PATENT DOCUMENTS

| | | | |
|---|---|---|---|
| 4,837,628 A | 6/1989 | Sasaki | |
| 5,293,167 A | 3/1994 | Campbell, Jr. et al. | |
| 5,710,563 A | 1/1998 | Vu et al. | |
| 5,874,909 A | 2/1999 | Soenen et al. | |
| 5,886,659 A * | 3/1999 | Pain et al. | 341/155 |
| 5,898,396 A | 4/1999 | Shimomura et al. | |
| 6,137,533 A | 10/2000 | Azim | |
| 6,184,809 B1 | 2/2001 | Yu | |
| 6,243,034 B1 * | 6/2001 | Regier | 341/166 |
| 6,252,536 B1 | 6/2001 | Johnson et al. | |
| 6,288,663 B1 | 9/2001 | Hester et al. | |

(Continued)

OTHER PUBLICATIONS

Kwok et al.; "Power Optimization for Pipeline Analog-to-Digital Converters"; May 1999; IEEE Transactions on Circuits and Systems—II: Analog and Digital Signal Processing; vol. 46, No. 5; pp. 549-553.*

(Continued)

*Primary Examiner*—John M Villecco
(74) *Attorney, Agent, or Firm*—Steven Lin, Esq.

(57) ABSTRACT

A processing system for a charge coupled device (CCD) or CMOS imaging system includes a correlated double sample (CDS) circuit for receiving data from an imager, a variable gain amplifier (VGA) having amplifiers of selectable current level to enable reduced data resolution in a preview display, a low power mode analog-to-digital converter (ADC) having a selectable narrow bit-width output and coupled to said VGA circuit, and a gain circuit coupled to said ADC. The single chip low-power analog front end produces digitized CCD data in either 13-bit, 12-bit or 10-bit formats at a first current level and 9-bit, 8-bit, or 6-bit formats at a second current level. The VGA amplifier includes symmetrical subcircuits which are independently actuable to enable full or reduced data resolution levels respectively for still image capture operation and video previewing on a separate preview screen.

18 Claims, 9 Drawing Sheets

U.S. PATENT DOCUMENTS

| | | | |
|---|---|---|---|
| 6,340,944 B1 * | 1/2002 | Chang et al. | 341/161 |
| 6,532,370 B1 * | 3/2003 | Underbrink et al. | 455/552.1 |
| 6,617,934 B1 * | 9/2003 | Holberg et al. | 331/57 |
| 6,650,364 B1 * | 11/2003 | Itani et al. | 348/229.1 |
| 6,686,957 B1 * | 2/2004 | Johnson et al. | 348/222.1 |
| 6,707,492 B1 * | 3/2004 | Itani | 348/229.1 |
| 6,720,999 B1 * | 4/2004 | Holberg et al. | 348/222.1 |
| 6,791,607 B1 * | 9/2004 | Bilhan et al. | 348/243 |
| 6,806,901 B1 * | 10/2004 | Mukherjee et al. | 348/243 |
| 6,980,148 B1 * | 12/2005 | Bahai | 341/161 |
| 7,009,548 B2 * | 3/2006 | Chiang et al. | 341/161 |
| 7,068,319 B2 * | 6/2006 | Barna et al. | 348/372 |
| 7,081,921 B2 * | 7/2006 | Nitta et al. | 348/229.1 |
| 7,205,923 B1 * | 4/2007 | Bahai | 341/161 |
| 2002/0057349 A1 | 5/2002 | Yamaguchi et al. | |
| 2003/0030729 A1 | 2/2003 | Prentice et al. | |
| 2004/0125008 A1 * | 7/2004 | Yamaji | 341/155 |
| 2005/0068218 A1 * | 3/2005 | Kobayashi et al. | 341/161 |

OTHER PUBLICATIONS

Lewis, Stephen H.; "Optimizing the Stage Resolution in Pipelined, Multistage, Analog-to-Digital Converters for Video-Rate Applications"; Aug. 1992; IEEE Transactions on Circuits and Systems—II: Analog and Digital Signal Processing; vol. 39, No. 8; pp. 516-523.*

* cited by examiner

PREVIEW MODE LOW RESOLUTION OUTPUT SYSTEM AND METHOD

CROSS REFERENCE TO RELATED APPLICATIONS

This application is a continuation of U.S. patent application Ser. No. 10/742,170 filed Dec. 19, 2003, now U.S. Pat. No. 7,304,679 which is a continuation application of U.S. patent application Ser. No. 09/282,524 filed on Mar. 31, 1999 entitled "Preview Mode Low Resolution Output System and Method" having inventors Sandra M. Johnson, Douglas R. Holberg, and Nadi R. Itani (Issued as U.S. Pat. No. 6,686,957 and is related to patent application Ser. Nos. 09/283,098; 09/283,112; 09/282,515; 09/283,779; 09/282,523, respectively entitled "Phase Locked Loop Circuits, Systems, and Methods" having inventors Douglas R. Holberg and Sandra Marie Johnson; "CCD Imager Analog Processor Systems and Methods" having inventors Douglas R. Holberg, Sandra Marie Johnson, Nadi Rafik Itani, and Argos R. Cue; "Amplifier System with Reducable Power" having as inventor Nadi Rafik Itani; "Dynamic Range Extender Apparatus, System, and Method for Digital Image Receiver System" having inventors Sandra Marie Johnson and Nadi Rafik Itani, which has issued into U.S. Pat. No. 6,252,536 on Jun. 26, 2001; and "Successive Approximation Apparatus, System, and Method for Dynamic Range Extender" having as inventor Nadi Rafik Itani; each of these applications filed on even date herewith, and each incorporated herein by reference in its entirety.

BACKGROUND OF THE INVENTION

1. Field of the Invention

This invention relates to analog and digital processors and methods, and more particularly to preview mode low resolution output systems and methods for charge coupled devices (CCDs), CMOS imagers, and cameras.

2. Description of the Related Art

Camera systems using charge coupled devices (CCDs) and imagers of many kinds are well-known for capturing signals according to many different CCD output formats and pixel configurations. According to one such format, in order to obtain a still image with acceptable resolution and contrast from a CCD, a minimum of 10 bits of resolution is desired. To practically capture a CCD image, the data read-out time from the CCD is very limited. Accordingly, one such front end interface which accepts CCD data for conversion into digital form operations typically up to 16 MHz with a 10-bit analog-to-digital converter. A camera using this front-end can produce a digital still image with up to 8 k×8 k pixels. The feature set available in known CCD camera system is increasing to include more functionality, as well as extended dynamic range. Such extended functionality comes at a price in terms of electronic complexity and power consumption. For example, some current camera systems include a liquid crystal display (LCD) screen to enable viewing of images in a real-time viewfinder. This requires the CCD and associated processing chips to run in a video mode and to remain powered up while the screen is in use. This can dissipate a large amount of power that tends to shorten battery life. In such an operational mode, front end circuitry is operated at a resolution level which is unnecessary for driving the relatively low resolution LCD display, thereby consuming power needlessly.

Accordingly, there is a need to enable low power operation of the analog and digital subsystems in CCD camera and imager systems that convert analog data into digital signal forms for user applications. It is desirable to achieve lower power even at a sacrifice in resolution in the front end system.

SUMMARY OF THE INVENTION

According to one embodiment of the present invention, a processing system for an imager device includes a camera system for producing a desired imager signal which operates in a reduced power or preview mode. Such a system according to the present invention includes a correlated double sample (CDS) circuit for receiving data from a selected imager, a multi-mode (selectably high or low current) variable gain amplifier (VGA), a low power mode analog-to-digital converter (ADC) having a selectable narrow bit-width output and coupled to said CDS circuit. The low power mode enables production of an ADC output signal of selectable higher or lower resolution. The processing system according to the present invention includes a gain adjust block (GAB) coupled to the ADC, a black level adjustment circuit including a predetermined clamp setting, a compander circuit coupled to said GAB for further reducing the output bit-width, a multiplexer permitting selection of output signals of selected bit-width, and a phase-lock-loop (PLL) for controlling a multi-sync timing generator including an analog clock generator (ACG). According to the present invention, the compander bit-width reduction compresses the output so a smaller bit-width signal can retain the same dynamic range as a larger bit-width signal, while the ADC output bit-width reduction sacrifices resolution. According to one embodiment of the present invention, by reducing the resolution requirement of the camera system front end to a selected number of bits during a still camera viewfinder video mode of operation, the power dissipated by the camera system is reduced substantially. In particular according to one embodiment of the present invention, a signal processing system (SPS) on an integrated substrate for a camera has a reduced power preview mode. The camera includes analog front-end (AFE) circuitry with digital outputs selectable for multiple bitwidths and having selectable high and low resolution (preview) output modes, and digital signal processing system (DSPS) circuitry connected to the analog front-end (AFE) circuitry. Further according to the present invention, a signal processing system (SPS) for an imager device includes a camera system for producing an imager signal, a correlated double sample (CDS) circuit for receiving data from an imager, a multi-mode variable gain amplifier (VGA), a low power mode analog-to-digital converter (ADC) having a selectable narrow bit-width output and coupled to said CDS circuit, a digital gain circuit (DGC) coupled to the ADC, and a compander circuit coupled to said DGC for further reducing the output bit-width of the camera system.

DETAILED DESCRIPTION OF THE PREFERRED EMBODIMENTS

Figure 1:
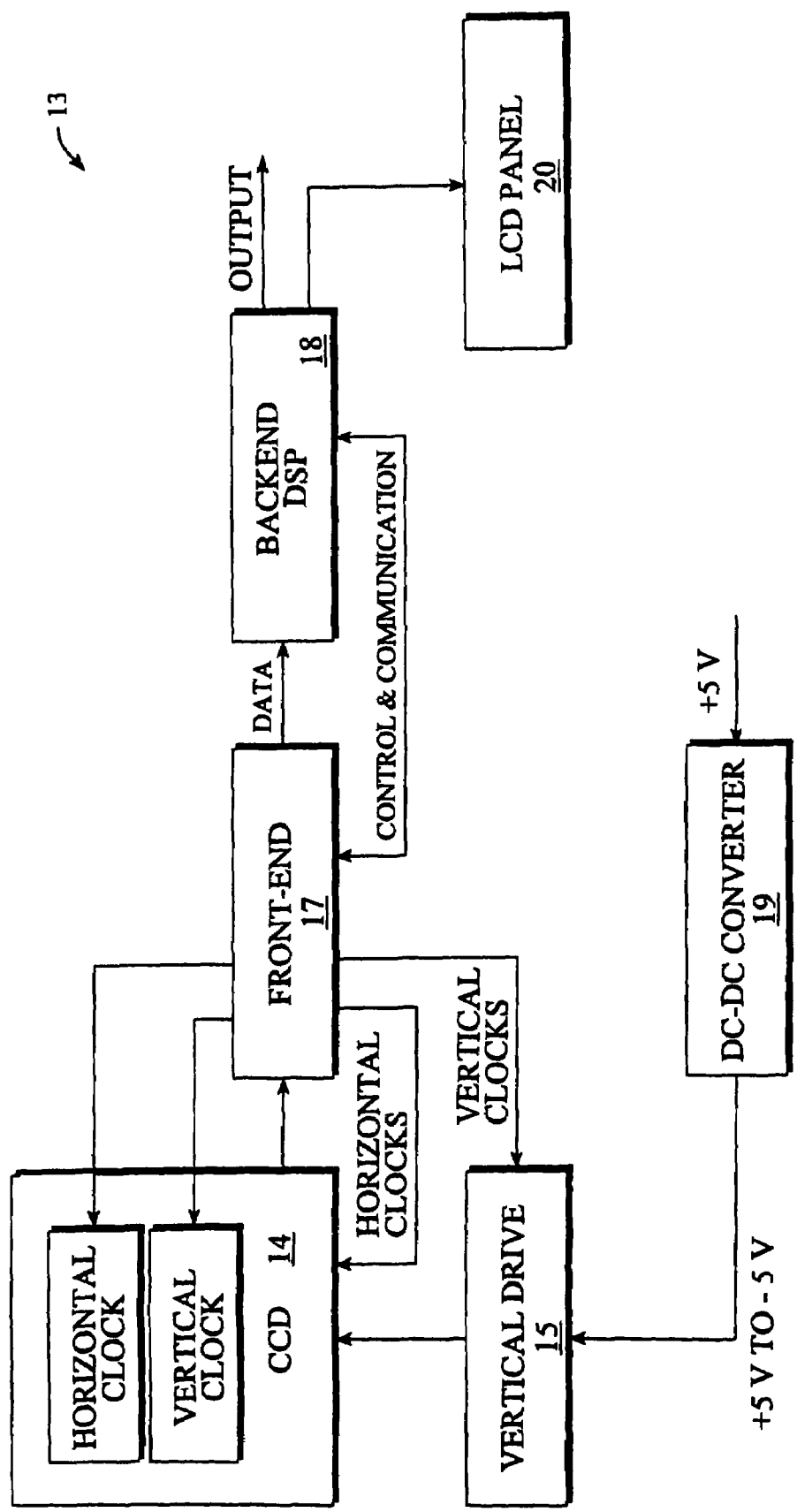
FIG. 1 is a block diagram of a CCD camera system according to the present invention.

Referring now to FIG. 1, there is shown a block diagram of a camera system 13, according to the present invention. As shown in FIG. 1, camera system 13 according to the present invention includes the following integrated circuit (IC) components, according to one embodiment of the present invention: a CCD array sensor 14, a vertical driver circuit 15, first and second signal processing subsystems (SPS) 17 and 18 (i.e., a front-end and a back-end subsystem), a DC-to-DC converter 19, and a display system such as for example without limitation a liquid crystal display (LCD) panel 20. The LCD panel 20 is connected to second SPS 18 for receipt of a digital signal input. First SPS 17 is an analog signal processing (ASP) front-end (AFE) system which receives and processes video samples from the CCD array sensor 14 and generates timing clocks and pulses required by the CCD array sensor 14, and vertical driver circuit 15. The vertical driver circuit 15 generates high voltage vertical shift register clock signals. The video output of the CCD array sensor 14 is directly connected to the input of the first SPS 17 through an emitter-follower and AC coupling capacitor. DC-to-DC converter 19 receives unregulated 5 volts DC and produces first and second regulated output voltages at 5 and −5 volts.

Figure 2:
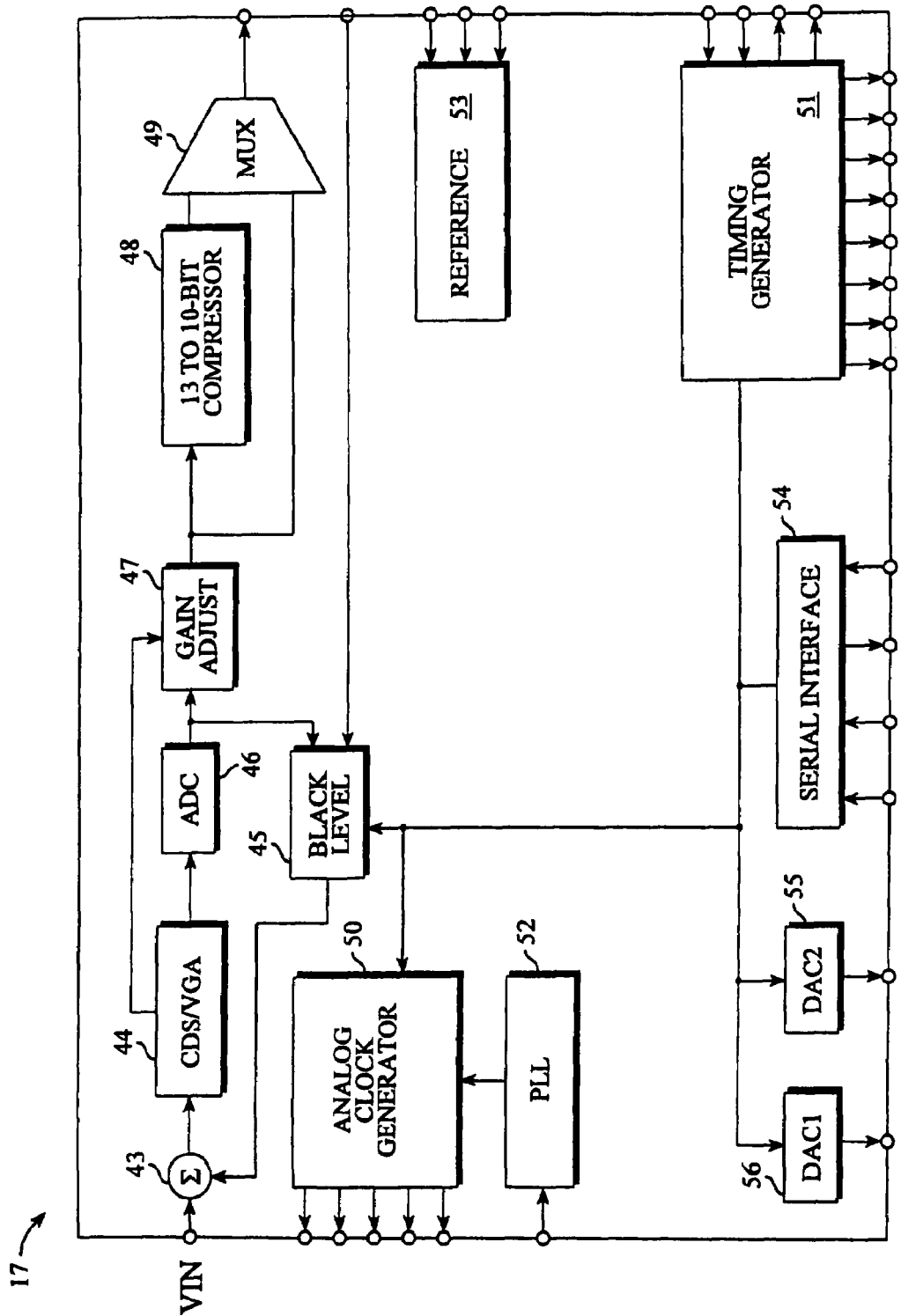
FIG. 2 is a block diagram of an analog image processing subsystem (AIPS) according to the present invention.

Referring now to FIG. 2, there is shown a block diagram of the first signal processing system (SPS) 17 according to the present invention. The Figure particularly shows a block diagram of an analog image processor subsystem (AIPS) referred to generally as front-end in accordance with one embodiment of the present invention. First SPS 17 includes a summation node 43, a correlated double sampler and variable gain amplifier (CDSVGA) circuit 44 receiving data in the form of an input voltage (VIN) from an image acquisition device (or imager), such as are conventionally known, an analog-to-digital converter (ADC) 46 connected to CDSVGA circuit 44, a black level adjustment circuit (SLAC) 45 feeding back to the summation node 43, a gain adjustment circuit 47, a 13 to 10 bit compressor circuit 48, and a multiplexer circuit 49 for permitting selection of outputs between the compressor circuit 48 and gain adjustment circuit 47. Gain adjustment circuit 47 is connected at its input to ADC 46 and at its output to compressor circuit 48. AIPS 17 additionally includes an analog clock generator circuit 50, a timing generator circuit 51, a phase lock loop (PLL) circuit 52, a reference circuit 53, a serial interface circuit 54, and first and second digital-to-analog converters 55 and 56. Gain adjustment circuit 47 is controlled by CDSVGA circuit. PLL circuit 52 contributes to control of analog clock generator circuit 50. Timing generator circuit 51 provides timing signals to external circuitry (not shown). Serial interface 54 is connected for communication with black level circuit 45, analog clock generator 50, PLL 42, DAC1 56, and DAC2 57.

Figure 3:
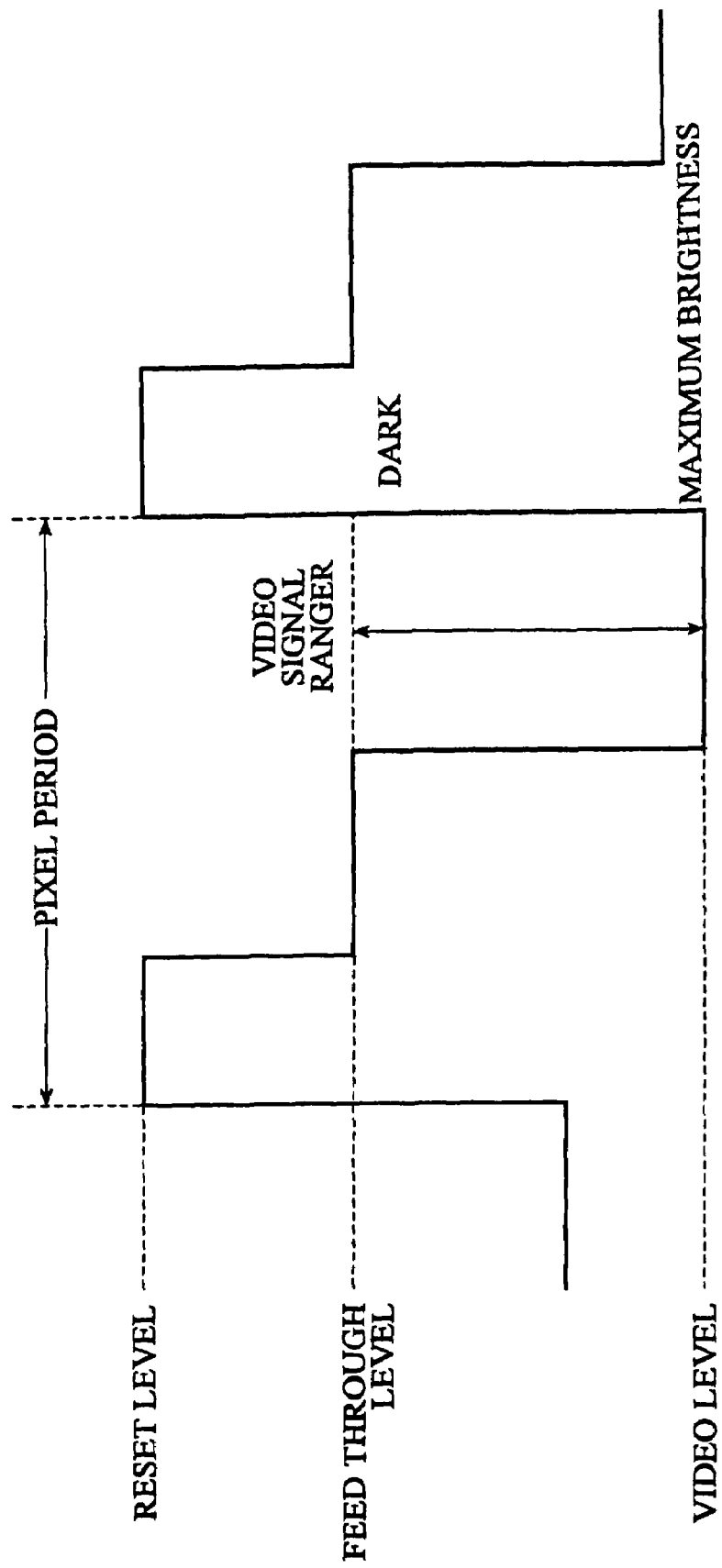
FIG. 3 is a diagram of an ideal output waveform of a selected imager, which is processed in accordance with one embodiment of the present invention.

Referring now to FIG. 3, there is shown a diagram of an ideal output waveform of a selected imager, which is processed in accordance with one embodiment of the present invention. Referring specifically to FIG. 3, there is shown a diagram of an ideal output waveform of a selected imager used in connection with the present invention. Correlated double sampling according to the present invention is accomplished by receiving imager output signal which includes reset noise, thermal noise, and 1/f noise, that are generated by the imager. The noise received degrades the S/N ratio and is cancelled by correlated double sampling according to the present invention. Noise received during the active video portion of the CCD signal is assumed to be correlated with the noise originating during the feed-through portion of the signal. This noise is cancelled by subtracting the feed-through level from the video level with correlated double sampling according to the present invention. The active video signal is the difference between feed-through and video levels according to the present invention. The active video signal varies according to light conditions. In order to insure that the full dynamic range of the ADC 46 is utilized even under low light conditions, the imager output is amplified using a variable gain amplifier (VGA).

Figure 4A:
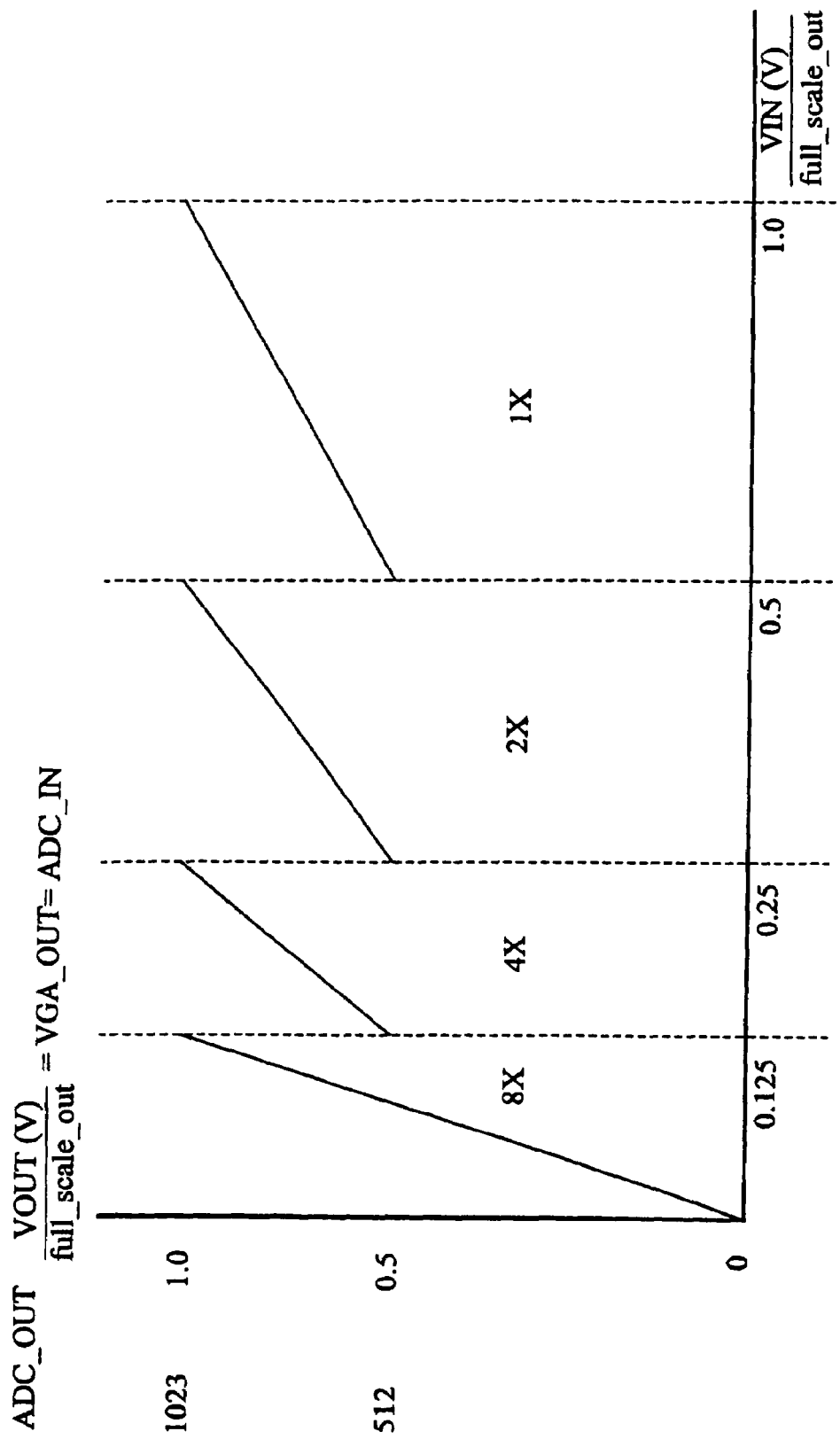
FIG. 4A is a diagram of the transfer function of a VGA circuit according to one embodiment of the present invention.

Referring now to FIG. 4A, there is shown a diagram of the transfer function of a CDS/VGA circuit 44 according to one embodiment of the present invention. In particular, FIG. 4A is a graph of the output of CDS/VGA circuit 44 for selected gain settings of 1×-8×, according to one embodiment of the present invention. The Figure expresses the relationship between VGA_OUT and ADC_OUT. Specifically, VGA_OUT=0 maps to code 0 at ADC_OUT and VGA_OUT=full scale maps to code 1023 at ADC_OUT. The ADC_OUTPUT, i.e., the output of the analog-to-digital converter 46, can range from zero to full-scale (i.e., from code zero to code 1023) while VGA_INPUT values range from zero to about 0.125 at a gain setting of 8×. Alternatively, the output of the analog-to-digital converter 46, can range from half-scale to full scale (i.e., from code 512 to 1023) when the VGA_INPUT values range from about 0.125 to about 0.25 at a gain setting of 4×. In another case, the output of the analog-to-digital converter 46, can range from half-scale to full-scale, while the VGA_INPUT ranges from about 0.25 to about 0.5 at a final gain setting of 2×. In another case, the output of the analog-to-digital converter 46, can range from half-scale to full-scale, while the VGA_INPUT ranges from about 0.5 to about 1.0 at a gain setting of the CDS/VGA 44 of 1×. In operation according to the present invention, the highest possible gain setting is selected for a particular VGA input signal. When a trip point is reached at which the VGA input corresponds to an out-of-range ADC output value, e.g., greater than code 1023, the VGA gain is reduced to a next lower level, which is one half of the immediately prior gain. The trip points lie at regularly spaced intervals from each other, for example at VGA input values which are double the value of the next lower valued trip point. As the VGA input increases in value beyond a particular trip point, the gain of the CDS/VGA 44 is cut in half, resulting in a halved ADC 46 output level. For example, when the ADC output reaches approximately 1023 according to one embodiment, the output level of the ADC 46 abruptly drops to one half of 1023, i.e., approximately to 512, as the gain of the VGA is suddenly cut in half.

Figure 4B:
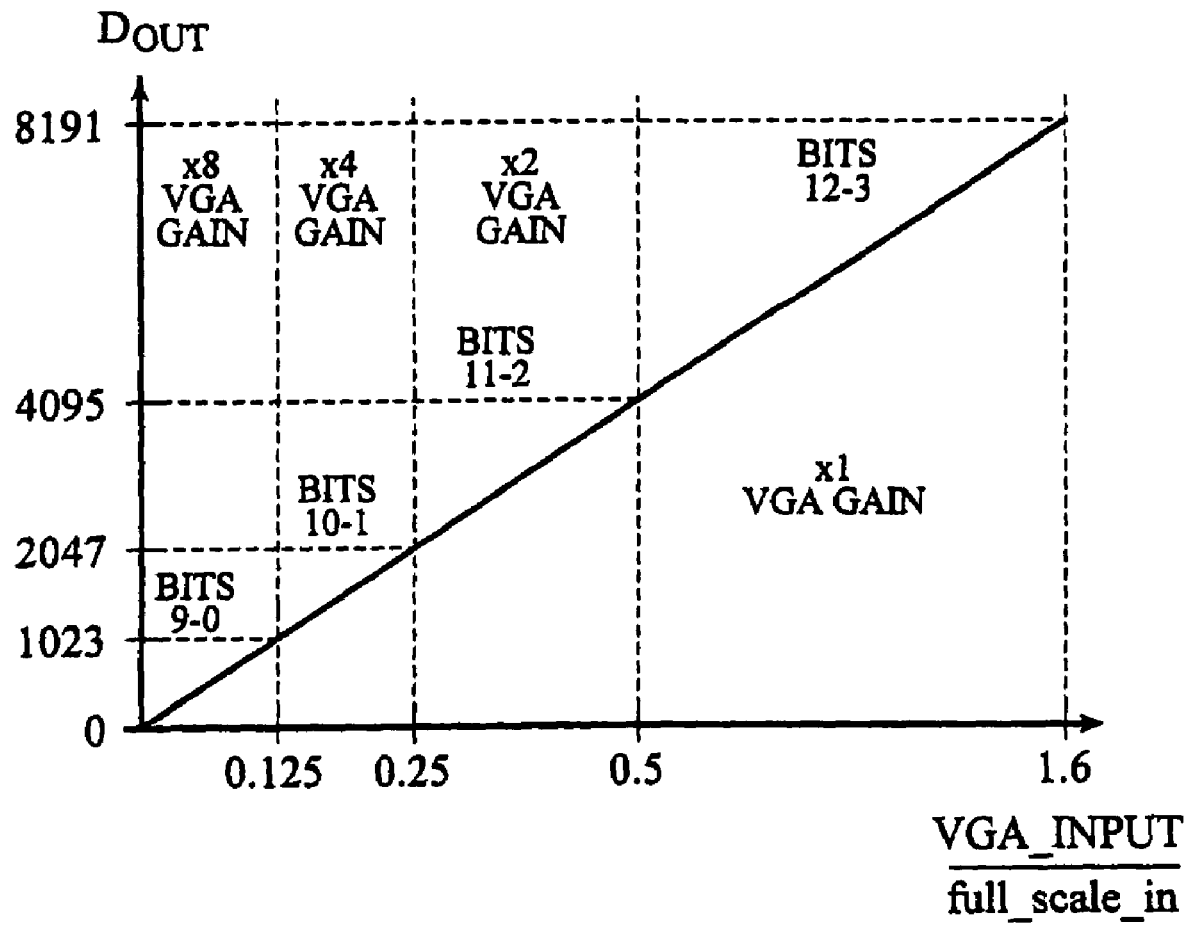
FIG. 4B is a graph of DOUT as a function of VGA input, with DOUT ranging from zero to 8191, according to one embodiment of the present invention.

Referring now to FIG. 4B, there is shown a graph of the output of the gain adjust block 47 as a function of VGA input, with DOUT ranging from zero to 8191, according to one embodiment of the present invention. The gain adjust block 47 is sued according to the present invention to back out or perform the reverse operation of what is done in the VGA. For example, if a gain of 8 applied in the VGA, the gain adjust block shift the output by 3 bit to the right, thus performing a divide by 8 operation. Thus, whatever the grain is which is applied by the VGA, the gain adjust block applies the inverse of this gain. Accordingly, the output of the gain adjust block contains 13 bits according to one embodiment, and the dynamic range of the 10-bit ADC is increased by 3 bits. To express the DOUT range corresponding to a VGA_INPUT range from zero to a value of about 0.125*full_scale_in, output bits 9-0 are employed. To express the DOUT range corresponding to a VGA_INPUT range from 0.2 to about 0.25*full_scale_in, output bits 10-1 are employed. To express the DOUT range corresponding to a VGA_INPUT range from 0.25*full_scale_in to about 0.5*full_scale_in, output bits 11-2 are employed. To express the DOUT range corresponding to a VGA_INPUT range from 0.5*full_scale_in to about 1.0*full_scale_in, output bits 12-3 are employed. As can be seen, the curve of DOUT is smooth, monotonic, and continuous, even at transitions associated with trip points 0.125, 0.25, and 0.5*full_scale_in. The point 1.0*full_scale_in marks the end-of-range for VGA input values, and does not represent a trip point according to this embodiment of the present invention. According to another embodiment of the present invention, in which a 3-bit ADC or an n-bit ADC is used in lieu of an 2-bit ADC, additional thresholds are established within the scope and meaning of the present invention. Such thresholds amount to additional trip points.

Figure 5A:
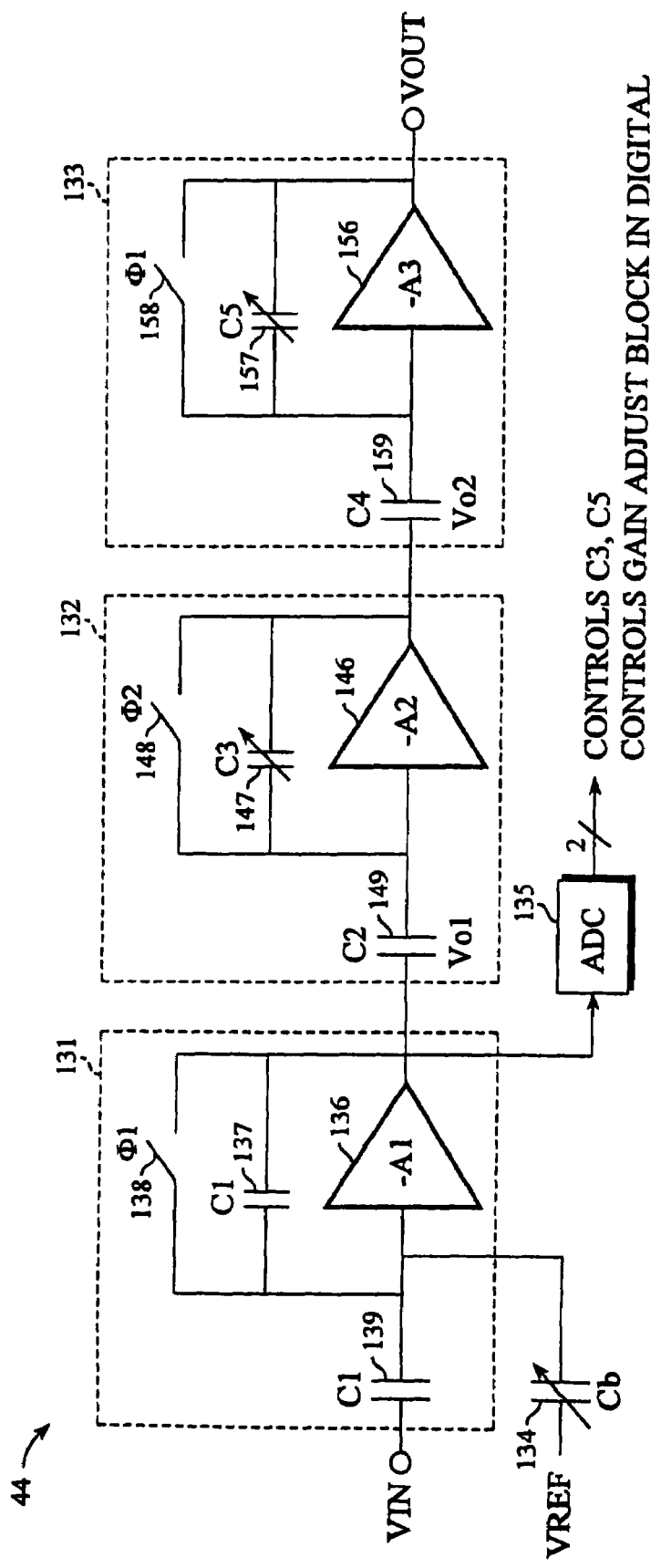
FIG. 5A is a block diagram of a correlated double sampling variable gain amplifier (CDS/VGA) for an analog data processing subsystem according to the present invention.

Referring now to FIG. 5A, there is shown a block diagram of a correlated double sampling variable gain amplifier (CDS/VGA) 44 for an analog data processing subsystem according to the present invention. Referring particularly to the Figure, there is shown a block diagram of CDS/VGA circuit 44 including first, second, and third CDS/VGA circuit stages respectively 131, 132, and 133, and a variable capacitor 134 connected to VREF, according to the present invention. First stage 131 includes a first amplifier 136 connected to variable capacitor 134; a fixed value capacitor 137 in parallel with first amplifier 136; a first switch 138 alternating between open and closed states in accordance with a clock φ1 in parallel with first amplifier 136; and a fixed value input capacitor connected to Vin. According to one embodiment of the present invention, capacitors 137 and 139 have the same capacitance. Second stage 132 of the CDS/VGA circuit 44 includes a second amplifier 146; a variable value capacitor 147 in parallel with second amplifier 146; a second switch 148 alternating between open and closed states in accordance with a clock φ2 in parallel with second amplifier 146; and a fixed value input capacitor connected to the output of first amplifier 136. The third stage 133 of the CDS/VGA circuit 44 includes a third amplifier 156; a variable value capacitor 157 in parallel with third amplifier 156; a third switch 158 alternating between open and closed states in accordance with a clock φ1 in parallel with third amplifier 156; and a fixed value input capacitor 159 connected to the output of second amplifier 146. The total gain of the CDSVGA circuit 44 according to the present invention is A=(C2/C3)*(C4/C5) and is adjustable according to the present invention by varying C3 and C5. CDS/VGA circuit 44 according to the present invention uses a two phase non-overlapping clock to perform the indicated CDS functions. The two phase clock according to the present invention also allows image signals to be passed to the output while maintaining a positive polarity signal. First stage 131 performs correlated double sampling (CDS) as follows. When clock φ1 is high, the feed-through level is sampled across first capacitor C1, and the output of the first stage is forced to a predetermined reference voltage level. When clock φ1 falls, the output voltage Vo1 of first amplifier 136 follows the input. Second stage 132 operates similarly, except that its switch is controlled by the second phase of the two phase non-overlapping clock. This adds a half clock delay, which is effective to maintain a positive output voltage with respect to the reference level. Third stage 133 operates similarly, but adds another half clock delay.

Figure 5B:
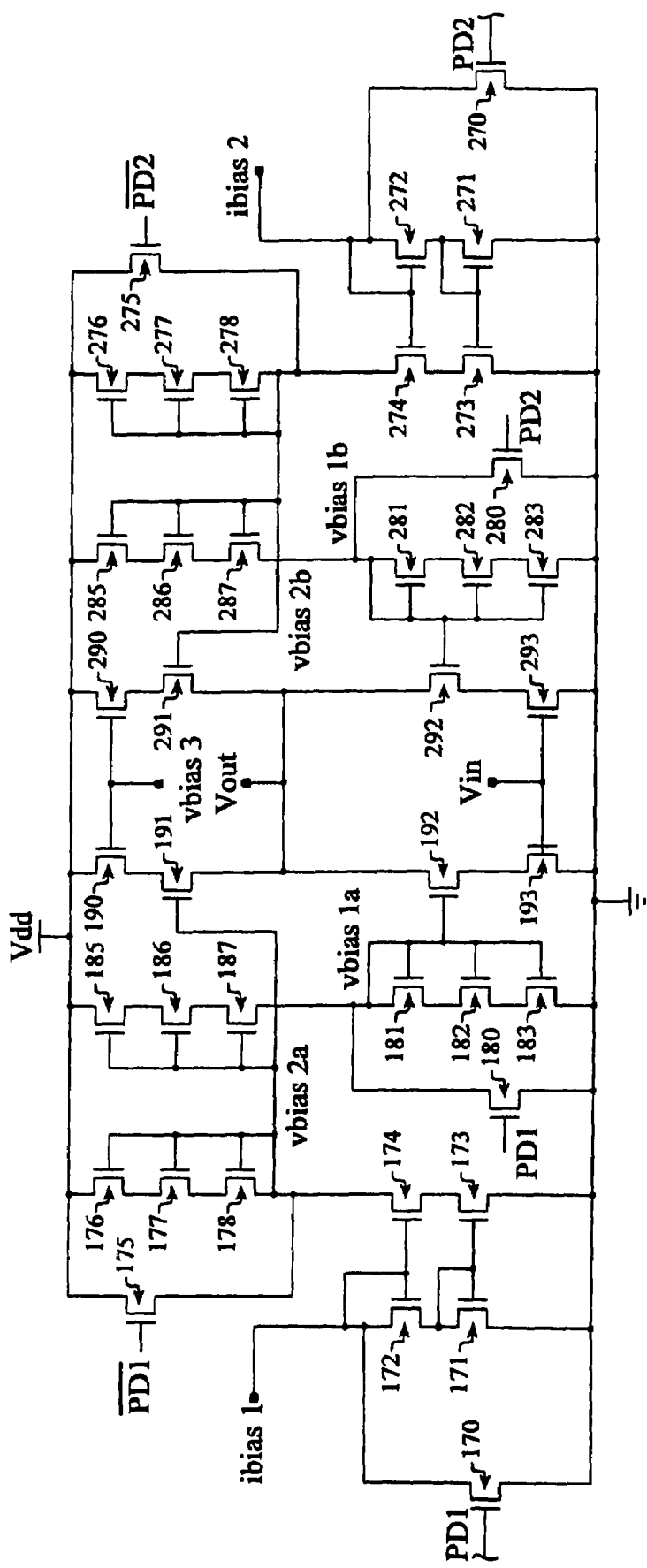
FIG. 5B is a circuit diagram of an amplifier according to an embodiment of the present invention, which is subject to power down performance during a preview mode of operation.

Referring now to FIG. 5B, there is shown a circuit diagram of an amplifier 146 according to an embodiment of the present invention, which is subject to power down performance during a preview mode of operation. According to one embodiment of the present invention, amplifiers 146 and 136 and 156 are constructed of a similar circuit architecture. The design of the power-down amplifier 146 according to the present invention is symmetrical, permitting the amount of current driven by amplifier 146 to be switched between first and second levels. According to one embodiment of the present invention, the first current level is one-half of the current level of the second current level. Amplifier 146 includes a transistor 170 connected in parallel with series transistors 172 and 171. Transistor 170 is controlled by a power-down signal, so that during power-down, current which would otherwise pass through series transistors 171 and 172 is instead diverted to by-pass the series transistors 171, 172. The series transistors 171 and 172 are connected in parallel with series transistors 173 and 174, in a current mirror arrangement which insures that the current flowing through the second set of series transistors 173, 174 is a function of the current through the first set of series transistors 171, 172. As a result, if current does not flow through series transistors 171, 172 as a result, for example, of the current having been by-passed to flow through transistor 170 during power-down operation, there will consequently also be no current flow through transistors 173, 174. In addition to diverting current, transistor 170 also acts to pull the ibias voltage to a low state or close to ground. The specific functional relationship between series transistors 171, 172 and series transistors 173, 174 is a linear relationship, according to one embodiment, and even more specifically, the current magnitude through transistors 173, 174 will be a factor of four times the current through transistors 171, 172. This is a consequence of the current mirror relationship between the respective transistors which results from the size or w/L ratio of the mirrored devices 173 and 174 to the size or the w/L ratio of the devices being mirrored 171 and 172. Amplifier 146 further includes a transistor 175 in parallel with diode-connected series transistors 176-178. The series connection between diode-connected series transistors 176-178 establishes a long device which is subject to being current by-passed, when transistor 175 is activated during power-down. Transistor 175 acts to provide extra power down functionality for any trickle of current that might have been passed through to transistors 173 and 174. Simply stated, during power-down operation, any remaining current is drawn through transistor 175, having the consequence that no current will flow during power-down through transistors 176-178. According to the present invention, the bias circuitry includes transistors 170-187 and 270-287; the amplifier section of the circuitry includes transistors 190-193 and 290-293. Transistors 185-187 are connected in a current mirror configuration to ensure that the current flowing through the second set of transistors 185-187 is a function of the current flowing through the first set of transistors 176-178. The specific functional relationship between series transistors 176-178 and series transistors 185-187 is linear, according to one embodiment. More specifically, the current flowing through transistors 185-187 is equal to the current through transistors 176-178, according to one embodiment. Amplifier 146 further includes a transistor 180 in parallel with the diode-connected series transistors 181-183. This is similar to the series transistors 176-178 connected in parallel to transistor 175 with nmos devices instead of pmos devices. Transistor 180 acts to provide extra power down functionality for any trickle of current that might have passed through to transistors 185-187. The operation of transistors 270-287 is analogous, except the current input comes from ibias2 rather than ibias1, and the power down signal is PD2 rather than PD1. Transistors 190-193 and 290-293 operate as amplifier circuitry. In particular, transistors 190 and 290, have their gates tied to a predetermined voltage level vbias3. These devices act as current sources with their current dependent on the voltage level of vbias3. Transistors 193 and 293 have their gates tied to Vin and are used to control the output (Vout) with a predetermined transfer characteristic from the input to the output. Transistors 191, 192, 291, and 292 have a dual function. During normal operation (non-power down), these transistors are provided with a bias voltage that is set up by the transistors surrounding the amplifier circuitry. In particular, transistors 176-178 set up a bias voltage (vbias2a) that goes to the gate of transistor 191, and transistors 276-278 set up the bias voltage (vbias1b) that goes to the gate of transistor 291. Further, transistors 181-183 set up the bias voltage (vbias1a) that goes to the gate of transistor 192, and transistors 281-283 set up the bias voltage (vbias1b) that goes to the gate of transistor 292. During normal operation, transistors 191, 192, 291, and 292 are used as cascode devices, and the bias voltages vbias1a,b and vbias2a,b are set such that these transistors operate in a saturated state. In saturation, these transistors cause an increase in DC gain from the input voltage Vin to the output voltage Vout. Moreover, during normal operation, transistors 192 and 292 act to isolate the input from the output, to eliminate capacitive coupling otherwise present between input and output nodes. During power-down action, transistors 191, 192, 291, and 292 turn off the current from respective amplifier circuitry branches. In particular, vbias2a,b nodes are held high, i.e., close to vdd) and vbias1a,b are held low, i.e., close to ground. With these voltages operating on the gates of transistors 191, 192, 291, and 292, the respective transistors act as open switches and do not allow any current to flow through the corresponding amplifier branches. Accordingly, the amplifier 146 is configured to have two independent power down control nodes, respectively PD1 and PD2. Thus, the amplifier 146 can be completely powered down or partially powered down by turning off one or the other of its two symmetrical sides. With half of the amplifier powered down, there is a power savings of one half normal operating power subject to a reduced drive level and a corresponding reduced settling time for amplified signals. During preview operation, the reduced settling time is acceptable, because the resolution needed for video display during preview is reduced and minor settling errors are tolerable.

Figure 6:
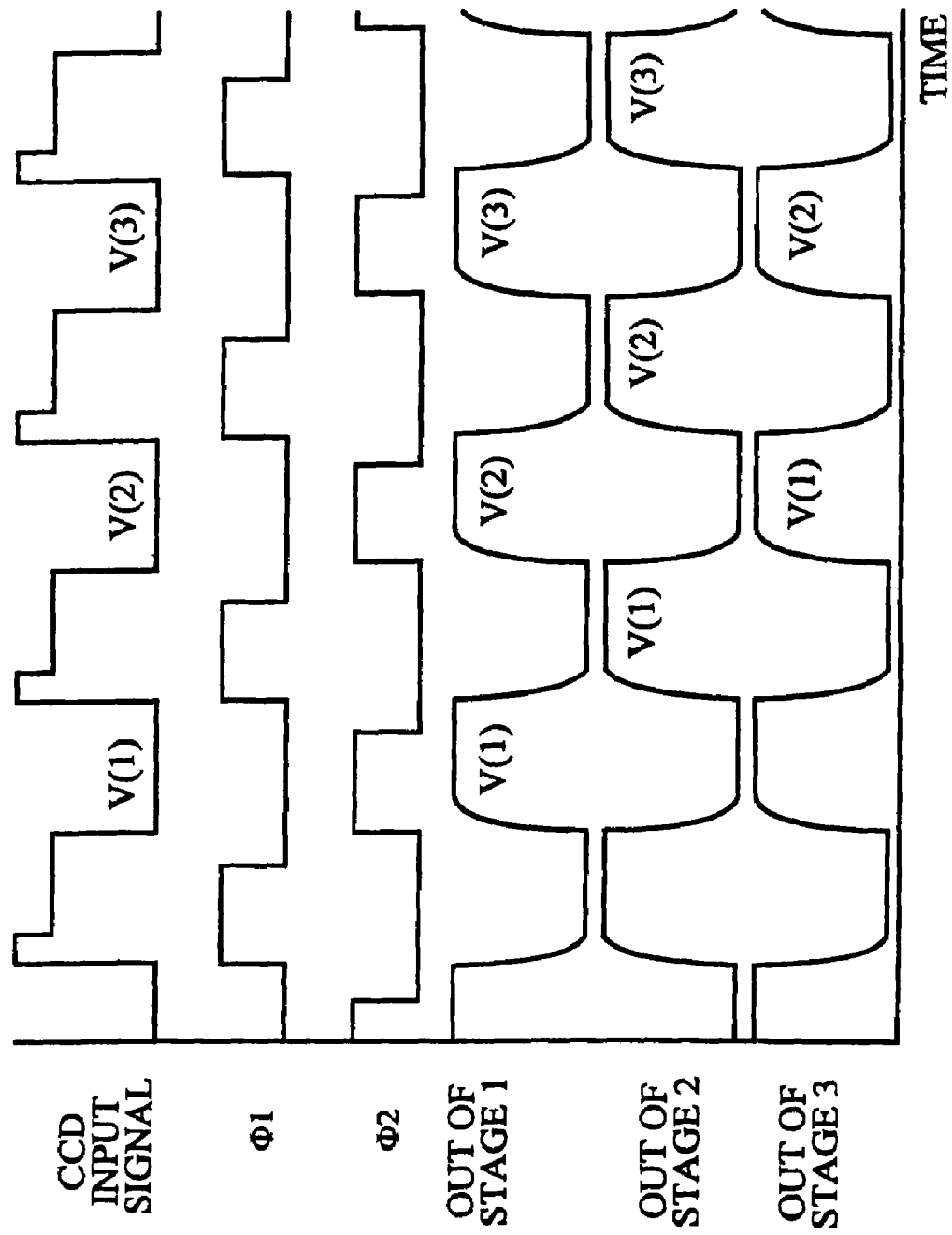
FIG. 6 is a timing diagram of the operation of a correlated double sampling variable gain amplifier (CDS/VGA) operating with a two phase clock according to an embodiment of the present invention.

Referring now to FIG. 6, there is shown a timing diagram of the operation of a correlated double sampling variable gain amplifier (CDS/VGA) 44 operating with a two-phase clock according to an embodiment of the present invention. In particular, there is shown a timing diagram of the two-phase clock of CDS/VGA circuit 114 and the imager signal, and the output signals of the first, second, and third stages, respectively 131, 132, and 133. In particular, the falling edge of φ1 occurs just before the transition from feed-through to active video, for example v(1), of the CCD input signal. The falling edge of clock φ2 occurs just before the transition from active video to reset of the CCD input signal. Clocks φ2 and φ1 are non-overlapping clocks. The output of stage 1 follows the CCD input, when φ1 is low. The output of stage two follows the output of stage 1, a half clock cycle earlier in time, when φ2 is low. The output of stage 3 follows the output of stage 2 from a half clock cycle earlier in time when φ1 was low.

Figures 7A, 7B:
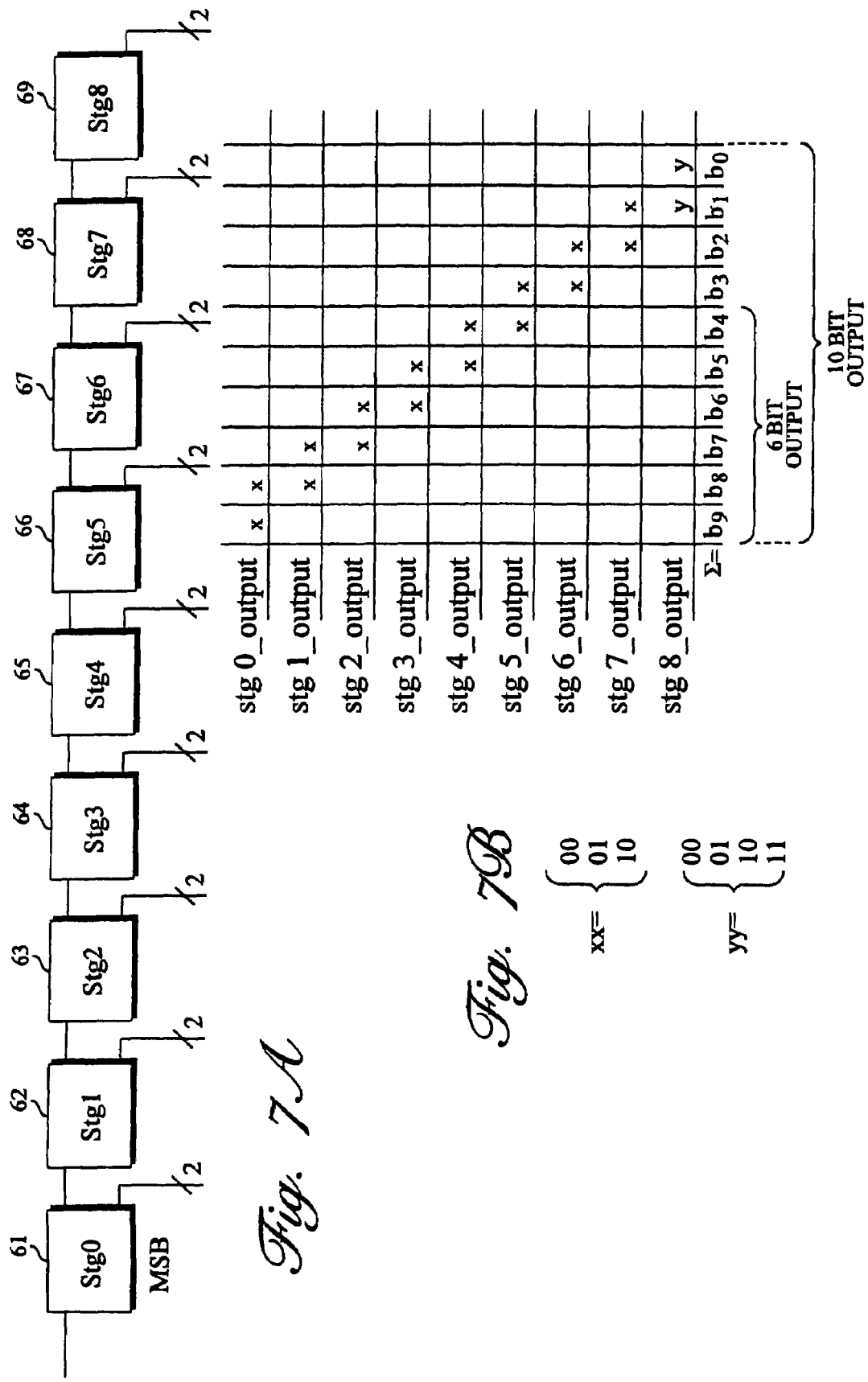
FIG. 7A is a block diagram of an analog-to-digital converter according to one embodiment of the present invention.
FIG. 7B is a diagram according to the present invention, which shows different levels of resolution output from an ADC, depending upon whether low significant value stages of the ADC are engaged for operation or disengaged.

Referring now to FIG. 7A, there is shown a block diagram of an analog-to-digital converter (ADC) 46 according to one embodiment of the present invention. In particular, the ADC 46 is a 10-bit pipelined ADC which includes nine ADC stages respectively 61-69, of which the last four stages 66-69 are turned off during the preview mode of operation in accordance with the present invention. Accordingly, the data from the ADC 46 during preview mode is of reduced resolution—a reduction, however, which is not apparent to the viewer of LCD panel 20, because the resolution level of LCD panel 20 is inherently hardware limited to a lower level, for example commonly about 6-bits.

Referring now to FIG. 7B, there is shown a diagram according to the present invention, which shows different levels of resolution output from ADC 46, depending upon whether low significant value stages of ADC 46 are engaged for operation or disengaged. The diagram particularly expresses the relationship between stages of ADC 46 and the output bits from the ADC 46. Each stage of ADC 46 outputs 2 bits. The two bits output by stg8 have a bit significance of LSB 1 and LSB. Each other stage's output has a significance that is twice the value of the subsequent stage's output. In equation form, this is understood as: $stgx\_output = two\_bit\_output * 2^{(8-x)}$. The output bits of ADC 46 are thus found by adding the outputs of all of the stages together, with their proper significance. When in preview mode, stg5-stg8 are powered down, and their outputs go to "00". Thus, bits $b_3$-$b_0$ are always "0000" in preview mode and accordingly contain no information. Thus, the additional resolution which would be provided by stages 5-8 is suppressed, as it would not have been relied upon in the expression of information on the face of LCD panel 20. By turning off the indicated stages of ADC 46, considerable power and battery savings are made, resulting in improved performance system-wide.

In summary according to the present invention, a processing system for a charge coupled device (CCD) or CMOS imaging system includes a correlated double sample (CDS) circuit for receiving data from an imager, a variable gain amplifier (VGA) having amplifiers of selectable current level to enable reduced data resolution in a preview display, a low power mode analog-to-digital converter (ADC) having a selectable narrow bit-width output and coupled to said VGA circuit, and a gain adjust circuit coupled to said ADC. The single chip low-power analog front end produces digitized CCD data in either 13-bit, 12-bit or 10-bit formats at a first current level and 9-bit, 8-bit, or 6-bit formats at a second current level. The VGA amplifier includes symmetrical sub-circuits which are independently actuable to enable full or reduced data resolution levels respectively for still image capture operation and video previewing on a separate preview screen.

What is claimed is:

1. A system for previewing an image, comprising:
   an image processor system that:
      receives an image signal for an image;
      amplifies said image signal at a higher current level and a lower current level;

converts said image signal into a digital signal correspondingly having a higher data resolution level and a lower data resolution level;

determines whether the image signal is to be previewed;

in response to the determination that the image signal is to be previewed, selects the lower current level to produce a preview digital image at the lower data resolution level; and comprises an analog-to-digital converter (ADC) for converting said image signal into the digital signal correspondingly having the higher data resolution level and the lower data resolution level wherein the ADC has a total number of ADC stages and a number of the total number of ADC stages that are used is changed between providing the higher data resolution level and the lower data resolution level for the digital signal.

2. The system according to claim 1, wherein a remaining number of the total number of ADC stages that are not used are turned off when the ADC converts said image signal into the digital signal having the lower data resolution level.

3. The system according to claim 2, wherein the total number of ADC stages is nine ADC stages and the remaining number of the total number of ADC stages that are turned off is four ADC stages.

4. The system according to claim 3, wherein the four ADC stages are the last four stages of the nine ADC stages.

5. The system according to claim 2, wherein the remaining number of the total number of ADC stages that are turned off is variably set to a certain number of the ADC stages depending on a desired level of the lower data resolution level for the digital signal.

6. A method for an image processor system to preview an image, comprising:

receiving an image signal for an image;

amplifying said image signal at a higher current level and a lower current level;

converting said image signal into a digital signal correspondingly having a higher data resolution level and a lower data resolution level;

determining whether the image signal is to be previewed; and in response to determining that the image signal is to be previewed, selecting the lower current level to produce a preview digital image at the lower data resolution level;

converting, by an analog-to-digital converter (ADC) having a total number of ADC stages, said image signal into the digital signal correspondingly having the higher data resolution level and the lower data resolution level; and changing a number of the total number of ADC stages that are used between providing the higher data resolution level and the lower data resolution level for the digital signal.

7. The method according to claim 6, further comprising:

turning off a remaining number of the total number of ADC stages when the ADC converts said image signal into the digital signal having the lower data resolution level.

8. The method according to claim 7, wherein turning off the remaining number of the total number of ADC stages when the ADC converts said image signal into the digital signal having the lower data resolution level and wherein the remaining number of the total number of ADC stages is four ADC stages and the total number of ADC stages is nine ADC stages further comprises:

turning off the four ADC stages of the nine ADC stages when the ADC converts said image signal into the digital signal having the lower data resolution level.

9. The method according to claim 8, wherein turning off the four ADC stages of then nine ADC stages when the ADC converts said image signal into the digital signal having the lower data resolution level further comprises:

turning off the last four ADC stages of the nine ADC stages when the ADC converts said image signal into the digital signal having the lower data resolution level.

10. The method according to claim 7, further comprising variably setting the remaining number of the total number of ADC stages that are turned off to a certain number of the ADC stages depending on a desired level of the lower data resolution level for the digital signal.

11. A system for previewing an image, comprising:

an image processor system that:

receives an image signal for an image;

amplifies said image signal at a higher current level and a lower current level;

converts said image signal into a digital signal correspondingly having a higher data resolution level and a lower data resolution level;

determines whether the image signal is to be previewed;

in response to the determination that the image signal is to be previewed, selects the lower current level to produce a preview digital image at the lower data resolution level; and comprises an analog-to-digital converter (ADC) for converting said image signal into the digital signal correspondingly having the higher data resolution level and the lower data resolution level wherein a bit format for an output of the ADC is changed when the digital signal changes between the higher data resolution level and the lower data resolution level.

12. The system according to claim 11, wherein the ADC provides an output in a high bit format for providing the higher data resolution level and another output in a low bit format for providing the lower data resolution level.

13. The system according to claim 12, wherein the high bit format is an output bit format among a 13-bit, 12-bit, and 10-bit format.

14. The system according to claim 12, wherein the low bit format is an output bit format among a 9-bit, 8-bit, and 6-bit format.

15. A method for previewing an image by an image processor system, comprising:

receiving an image signal for an image;

amplifying said image signal at a higher current level and a lower current level;

converting said image signal into a digital signal correspondingly having a higher data resolution level and a lower data resolution level;

determining whether the image signal is to be previewed;

in response to determining that the image signal is to be previewed, selecting the lower current level to produce a preview digital image at the lower data resolution level;

converting, by an analog-to-digital converter (ADC), said image signal into the digital signal correspondingly having the higher data resolution level and the lower data resolution level; and changing a bit format for an output of the ADC when the digital signal changes between providing the higher data resolution level and the lower data resolution level.

16. The method according to claim 15, further comprising:

outputting, by the ADC, an output in a high bit format for providing the higher data resolution level; and outputting, by the ADC, another output in a low bit format for providing the lower data resolution level.

17. The method according to claim 16, further comprising: setting the high bit format to be an output bit format among a 13-bit, 12-bit, and 10-bit format.

18. The method according to claim 16, further comprising: setting the low bit format to be an output bit format among a 9-bit, 8-bit, and 6-bit format.

* * * * *